United States Patent
Fei et al.

(10) Patent No.: US 11,824,016 B2
(45) Date of Patent: Nov. 21, 2023

(54) EPITAXIAL SEMICONDUCTOR STRUCTURE AND EPITAXIAL SUBSTRATE

(71) Applicant: PlayNitride Display Co., Ltd., MiaoLi County (TW)

(72) Inventors: Yuan-Ting Fei, MiaoLi County (TW); Chi-Heng Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 177 days.

(21) Appl. No.: 17/520,711

(22) Filed: Nov. 7, 2021

(65) Prior Publication Data
US 2022/0406733 A1    Dec. 22, 2022

(30) Foreign Application Priority Data

Jun. 17, 2021  (TW) ................. 110122019

(51) Int. Cl.
*H01L 23/00* (2006.01)
(52) U.S. Cl.
CPC .................. *H01L 23/562* (2013.01)
(58) Field of Classification Search
None
See application file for complete search history.

(56) References Cited

U.S. PATENT DOCUMENTS

| 2003/0162368 | A1 | 8/2003 | Connell et al. |
| 2011/0024878 | A1 | 2/2011 | Lee et al. |
| 2013/0023084 | A1 | 1/2013 | Carberry |
| 2022/0328425 | A1* | 10/2022 | Chou .................. H01L 21/0254 |

FOREIGN PATENT DOCUMENTS

| CN | 102420176 | 4/2012 |
| CN | 105098009 | 11/2015 |
| JP | H11153788 | 6/1999 |
| JP | 2001093863 | 4/2001 |
| JP | 2008139424 | 6/2008 |
| TW | 201703118 | 1/2017 |
| TW | 202205369 | 2/2022 |

OTHER PUBLICATIONS

"Office Action of Taiwan Counterpart Application", dated May 20, 2022, p. 1-p. 5.
"Notice of allowance of China Counterpart Application", dated Sep. 15, 2022, p. 1-p. 5.

* cited by examiner

*Primary Examiner* — Bo B Jang
(74) *Attorney, Agent, or Firm* — JCIPRNET

(57) ABSTRACT

An epitaxial semiconductor structure including a substrate, a semiconductor layer, and a balance structure is provided. The substrate has a first surface and a second surface opposite to each other. The semiconductor layer is formed on the first surface. The balance structure is formed on the second surface, the balance structure is configured to balance the thermal stress on the substrate, and the balance structure is composed of a plurality of non-continuous particulate materials. An epitaxial substrate is also provided.

14 Claims, 8 Drawing Sheets

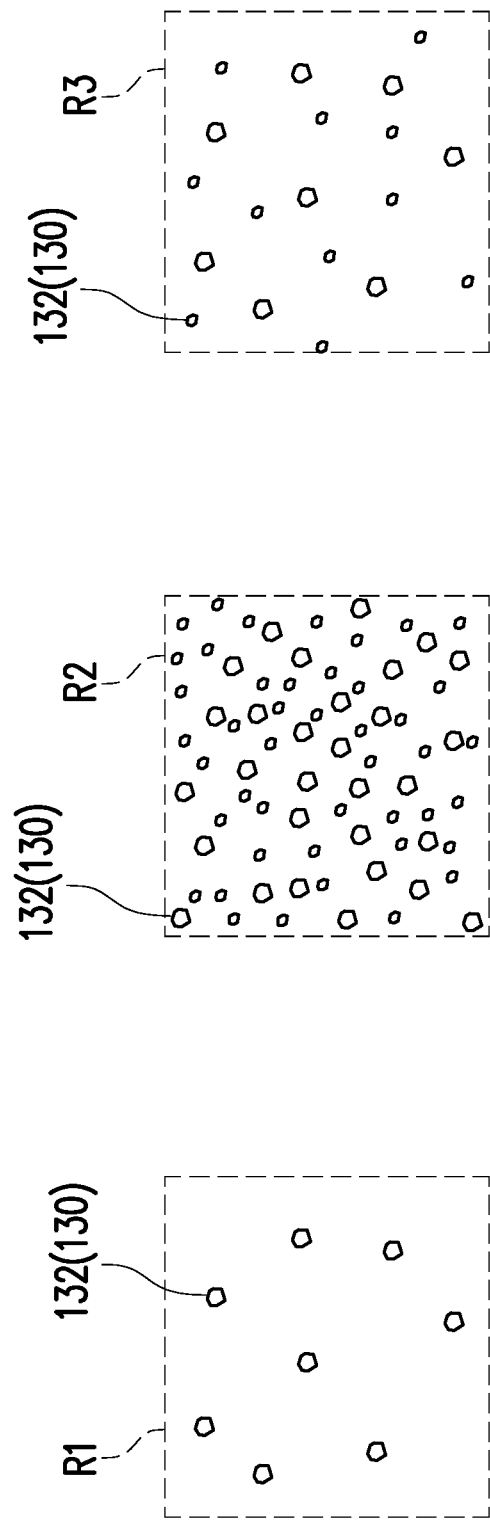

EPITAXIAL SEMICONDUCTOR STRUCTURE AND EPITAXIAL SUBSTRATE

CROSS-REFERENCE TO RELATED APPLICATION

This application claims the priority benefit of Taiwan application serial no. 110122019, filed on Jun. 17, 2021. The entirety of the above-mentioned patent application is hereby incorporated by reference herein and made a part of this specification.

BACKGROUND

Technical Field

The disclosure relates to a semiconductor structure and a substrate, and in particular to an epitaxial semiconductor structure and an epitaxial substrate.

Description of Related Art

In a manufacturing process of an epitaxial substrate, when a substrate material and an epitaxial layer material are heterogeneous, stress is likely to be accumulated due to differences in coefficient of thermal expansion and lattice size between the materials. Furthermore, in an epitaxy process, stress accumulation likely results in substrate warpage, thereby affects the thermal field and flow field evenness around the substrate, and reduces the quality of the epitaxial substrate, such that various optical characteristics of products that are subsequently formed on the epitaxial substrate are poor.

SUMMARY

The disclosure provides an epitaxial semiconductor structure and an epitaxial substrate, which adjust and control warpage generated in an epitaxy process, thereby improving quality of it.

An epitaxial semiconductor structure of the disclosure includes a substrate, a semiconductor layer, and a balance structure. The substrate has a first surface and a second surface opposite to each other. The semiconductor layer is formed on the first surface. The balance structure is formed on the second surface, the balance structure is configured to balance thermal stress on the substrate, and the balance structure is composed of multiple non-continuous particulate materials.

In an embodiment of the disclosure, the non-continuous particulate materials as mentioned above are randomly distributed on the second surface.

In an embodiment of the disclosure, a distribution density of the non-continuous particulate materials on the second surface is between 0.001 per/micrometer square to 10 per/micrometer square.

In an embodiment of the disclosure, surface coverage of the non-continuous particulate materials on the second surface is between 0.5% and 15%.

In an embodiment of the disclosure, the second surface as mentioned above is at least divided into a first region and a second region, and the non-continuous particulate materials have different surface coverage in the first region and the second region, respectively.

In an embodiment of the disclosure, the surface coverage of the non-continuous particulate materials in the first region is greater than the surface coverage of the non-continuous particulate materials in the second region.

In an embodiment of the disclosure, the second surface as mentioned above further includes a third region located between the first region and the second region, and the non-continuous particulate materials have different surface coverage in the first region, the second region, and the third region, respectively.

In an embodiment of the disclosure, the surface coverage of the non-continuous particulate materials in the third region is greater than the surface coverage of the non-continuous particulate materials in the first region and the second region.

In an embodiment of the disclosure, a size of each of the non-continuous particulate materials as mentioned above is between 1 nanometer and 3 micrometers.

In an embodiment of the disclosure, the second surface as mentioned above is a concavo-convex surface, and a ratio of roughness of the second surface to a size of each of the non-continuous particulate materials is between 0.1 and 3000.

In an embodiment of the disclosure, a ratio of the thickness of the substrate as mentioned above to a size of each of the non-continuous particulate materials is between 160 and 1,400,000.

In an embodiment of the disclosure, a material of the balance structure as mentioned above includes a semiconductor material or a compound semiconductor material.

In an embodiment of the disclosure, a thermal conductivity coefficient of the balance structure is greater than or equal to a thermal conductivity coefficient of the substrate.

In an embodiment of the disclosure, a ratio of the thermal conductivity coefficient of the balance structure to the thermal conductivity coefficient of the substrate is greater than or equal to 1 and less than or equal to 30.

In an embodiment of the disclosure, the material of the balance structure as mentioned above is the same as a material of the semiconductor layer.

An epitaxial substrate adapted for growth of a semiconductor layer includes a substrate and a balance structure. The substrate has a first surface and a second surface opposite to each other. The balance structure is formed on the second surface, the balance structure is configured to balance thermal stress on the substrate, and the balance structure is composed of multiple non-continuous particulate materials.

Based on the above, since the semiconductor layer and the balance structure are respectively formed on the two surfaces of the substrate that are opposite to each other, the thermal stress on the substrate is balanced through making the direction of stress generated by the balance structure to the substrate to be different from the direction of stress generated by the semiconductor layer to the substrate. In addition, since the balance structure is composed of multiple non-continuous partial materials, such that different epitaxy conditions are flexibly matched to correspond to the stress distribution on the substrate. Therefore, in the epitaxial semiconductor structure of the disclosure, warpage problem generated in the epitaxy process is effectively adjusted and controlled, and quality of the epitaxial semiconductor structure is improved, thereby products subsequently formed on the epitaxial semiconductor structure have better optical characteristics.

To further describe the above features and advantages of the disclosure, embodiments accompanied with drawings are described below in details.

BRIEF DESCRIPTION OF THE DRAWINGS

FIG. 2B is an enlarged schematic view of a block R1 in FIG. 2A.

FIG. 2C is an enlarged schematic view of a block R2 in FIG. 2A.

FIG. 2D is an enlarged schematic view of a block R3 in FIG. 2A.

DESCRIPTION OF THE EMBODIMENTS

Detailed features and advantages of the disclosure are described in the following embodiments, and the content is sufficient for those skilled in the art to understand the technical content of the disclosure and implement the technical content accordingly. Based on the content disclosed in this specification, the claims and drawings, those skilled in the art may easily understand the purpose and advantages related to the disclosure. The following embodiments further elaborate the disclosure, but do not limit the scope of the disclosure based on any descriptions.

Figure 1A:
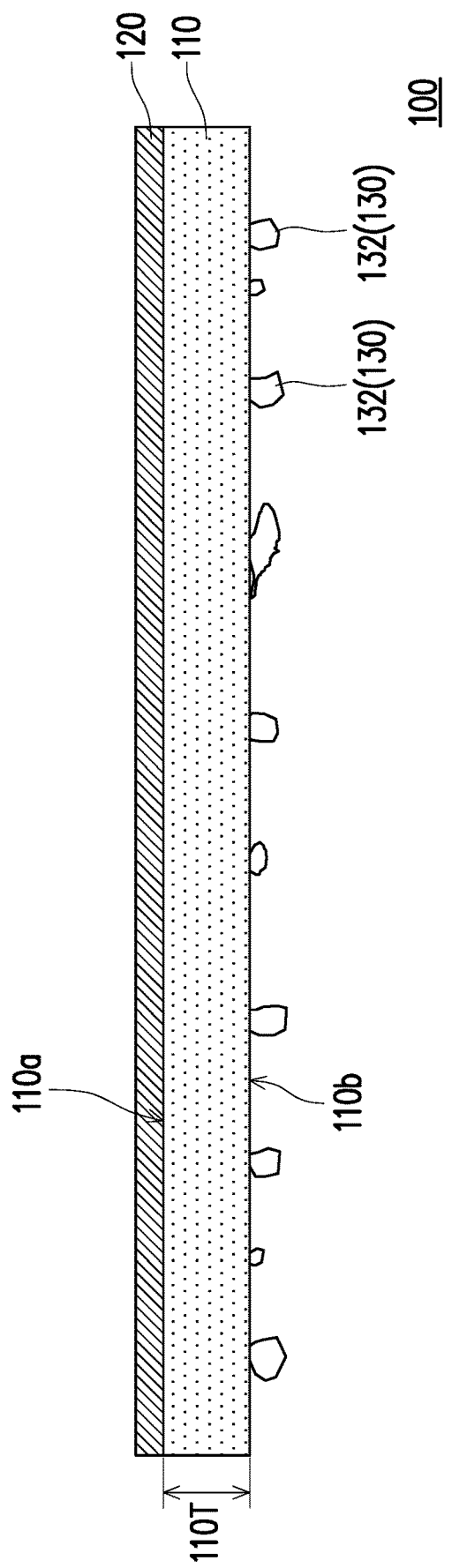
FIG. 1A is a schematic cross-sectional view of an epitaxial semiconductor structure according to an embodiment of the disclosure.
Figure 1B:
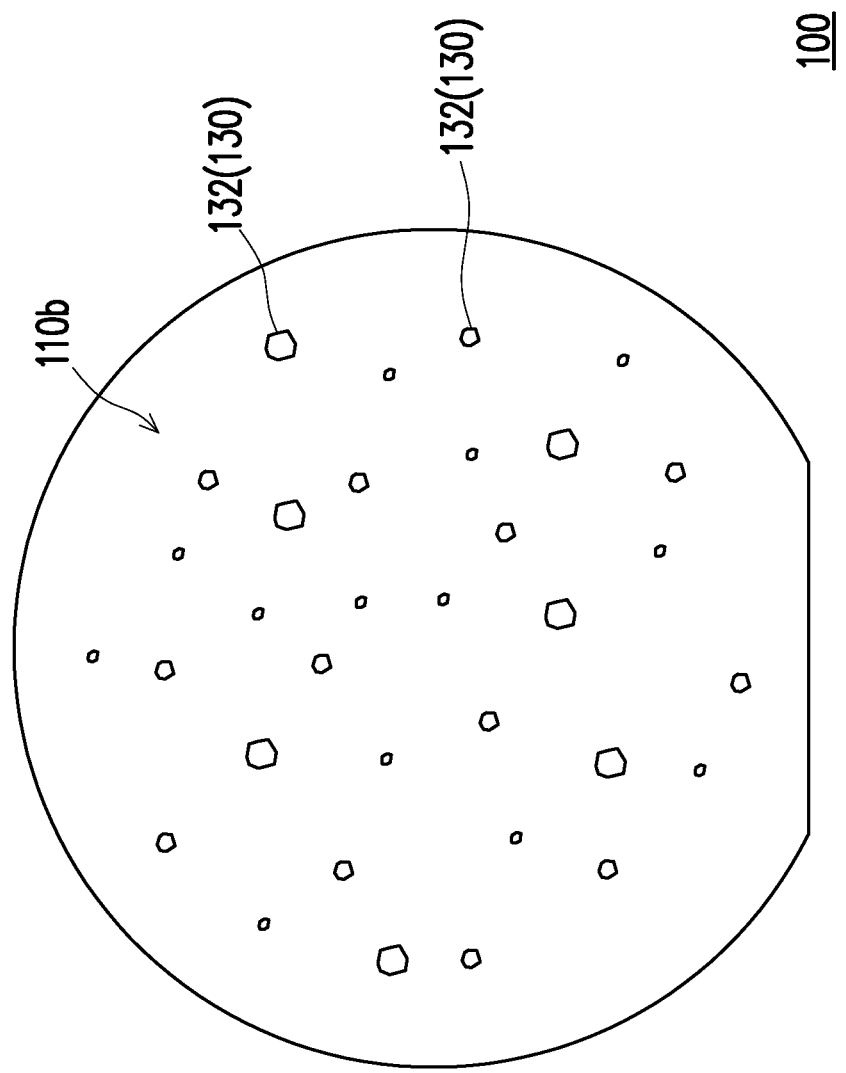
FIG. 1B is a schematic bottom view of an epitaxial semiconductor structure according to an embodiment of the disclosure.
Figure 1D:
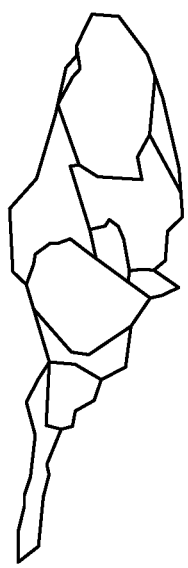
FIGS. 1C and 1D are enlarged schematic views of non-continuous particulate materials of FIG. 1A in some embodiments.
Figure 1C:
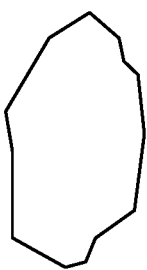
Figure 1E:
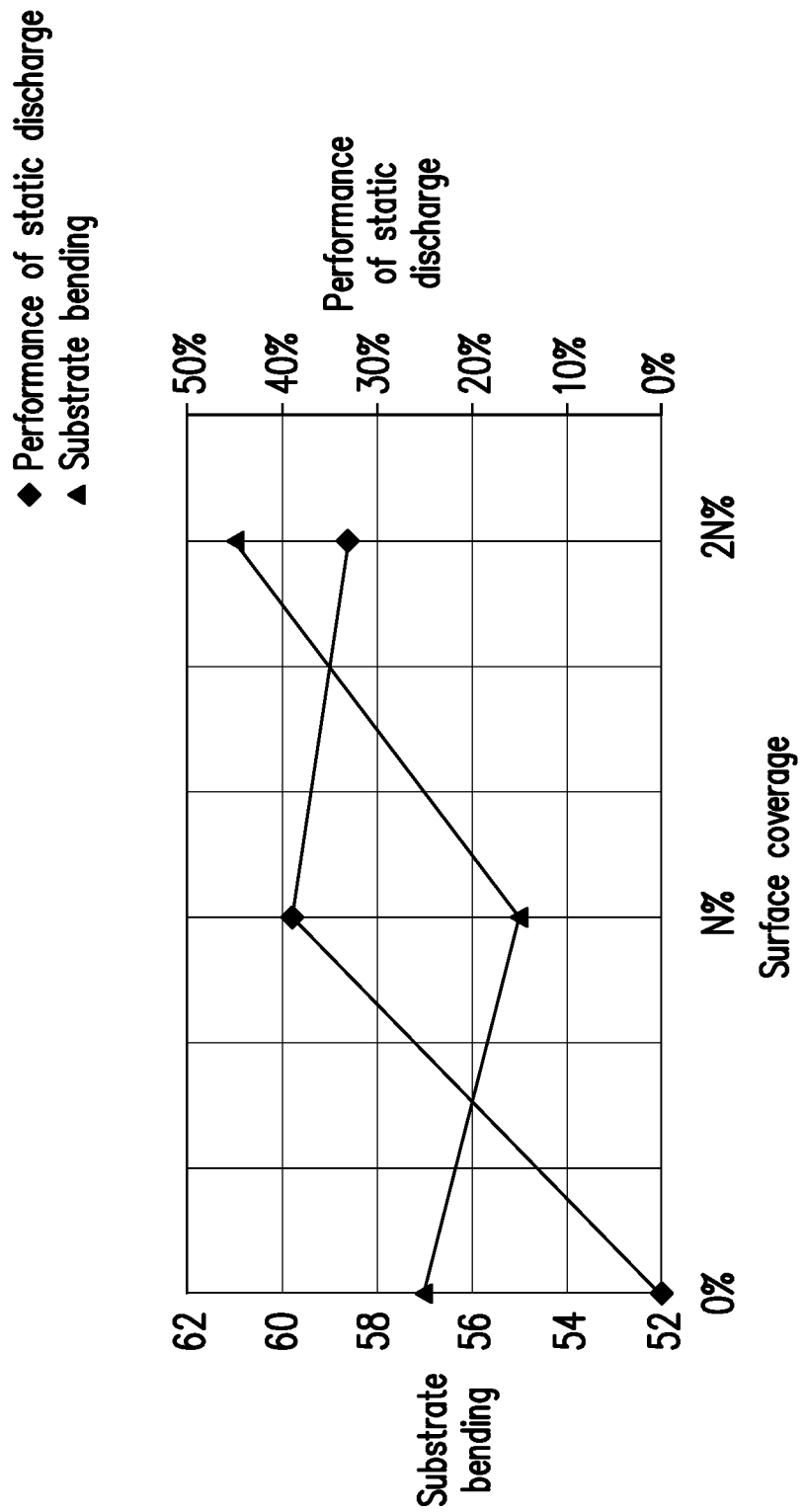
FIG. 1E is a graph showing the relationship between surface coverage of an epitaxial semiconductor structure and substrate bending and the relationship between surface coverage of the epitaxial semiconductor structure and performance of static discharge of a product according to an embodiment of the disclosure.

FIG. 1A is a schematic cross-sectional view of an epitaxial semiconductor structure according to an embodiment of the disclosure. FIG. 1B is a schematic bottom view of an epitaxial semiconductor structure according to an embodiment of the disclosure. FIGS. 1C and 1D are enlarged schematic views of non-continuous particulate materials of FIG. 1A in some embodiments. FIG. 1E is a graph showing the relationship between surface coverage of an epitaxial semiconductor structure and substrate bending and the relationship between surface coverage of the epitaxial semiconductor structure and performance of static discharge of a product according to an embodiment of the disclosure.

Referring to FIGS. 1A to 1E, in this embodiment, an epitaxial semiconductor structure 100 includes an epitaxial substrate adapted for growth of a semiconductor layer 120, wherein the epitaxial substrate includes a substrate 110 and a balance structure 130. In some embodiments, the material of the substrate 110 is different from the material of the semiconductor layer 120. In other words, the material of the substrate 110 and the material of the semiconductor layer 120 may be heterogeneous. In some embodiments, the material of the substrate 110 includes $Al_2O_3$, SiC, Si, or GaAs; the material of the semiconductor layer 120 includes a group II-VI material (for example, ZnSe) or a group III-V material (for example, AlGaAs, GaAsP, AlGaInP, AlGaP, InGaN, AlN, AlGaN, AlInGaN, GaN, GaAs or InN), but the disclosure is not limited thereto.

Specifically, the substrate 110 has a first surface 110a and a second surface 110b opposite to each other. The semiconductor layer 120 is formed on the first surface 110a, and the balance structure 130 is formed on the second surface 110b, and the balance structure 130 is configured to balance the thermal stress on the substrate 110. In the case that the semiconductor layer 120 and the balance structure 130 are respectively formed on the two opposite surfaces of the substrate 110 (that is, the first surface 110a and the second surface 110b), the direction of action of the thermal stress generated by the balance structure 130 to the substrate 110 is reverse to the direction of action of the thermal stress generated by the semiconductor layer 120 to the substrate 110, so that warpage of the substrate 110 is prevented. In addition, the balance structure 130 is composed of a plurality of non-continuous particulate materials 132. In this way, different epitaxy conditions may be flexibly matched to correspond to stress distribution on the substrate 110 by a design of the balance structure 130 (for example, surface coverage, density, etc.). Accordingly, warpage generated in the epitaxy process of the epitaxial semiconductor structure 100 of this embodiment may be effectively adjusted and controlled, and quality of the epitaxial semiconductor structure 100 may be improved. Therefore, products subsequently formed on the epitaxial semiconductor structure 100 may have better optical characteristics (for example, wavelength, luminance, electrical characteristics, or other suitable characteristics).

In some embodiments, the thermal stress between the balance structure 130 and the substrate 110 may be used to resist the thermal stress between the semiconductor layer 120 and the substrate 110 to adjust and control the warpage problem of the substrate 110. For example, when the coefficient of thermal expansion (CTE) or lattice constant of the semiconductor layer 120 is less than that of the substrate 110, and the semiconductor layer 120 forms tensile stress on the substrate 110 (for example, the substrate 110 is downward in the shape of a concave arc), the balance structure 130 which resists the above tensile stress to the substrate 110 may be formed, and the substrate 110 may thus be pulled back to a balanced position, and the warpage problem of the substrate 110 generated in the epitaxy process may be effectively adjusted and controlled, and vice versa. When the coefficient of thermal expansion or lattice constant of the semiconductor layer 120 is greater than that of the substrate 110, and the semiconductor layer 120 forms compressive stress on the substrate 110 (for example, the substrate 110 is upward in the shape of a convex arc), the balance structure 130 which resists the above compressive stress to the substrate 110 may be formed, and the substrate 110 may thus be pulled back to a balanced position, and the warpage problem of the substrate 110 generated in the epitaxy process may be effectively adjusted and controlled.

It should be noted that the arrangement layout of the non-continuous particulate materials 132 of the balance structure 130 on the second surface 110b may be designed according to the warpage status of the actual semiconductor layer 120 and the substrate 110. In other words, no matter what kind of warpage status, through adjusting the arrangement of the non-continuous particulate materials 132 on the second surface 110b, the warpage problem of the substrate 110 may be effectively reduced. The adjustment method of arrangement layout is determined by actual design requirements, so the disclosure does not limit the material and distribution status of the balance structure 130. As long as an arrangement includes the balance structure 130 formed by the plurality of non-continuous particulate materials 132 being formed on the surface of the substrate 110 opposite to the semiconductor layer 120 and being used to balance the thermal stress of the substrate 110, the arrangement belongs to the protection scope of the disclosure.

In some embodiments, the non-continuous particulate materials 132 are randomly distributed on the second surface 110b. In other words, the non-continuous particulate materials 132 may be irregularly arranged on the second surface 110b. In addition, the distribution density of the non-continuous particulate materials 132 on the second surface 110b may be between 0.001 per/micrometer square to 10 per/micrometer square. If the distribution density is too large, the resistance to the compressive stress may be increased to an extent that is too much. If the distribution density is too small, the resistance to the compressive stress may not be enough for balance, but the disclosure is not limited thereto.

On the other hand, the surface coverage (such as N % in FIG. 1E) of the non-continuous particulate materials 132 on the second surface 110b may be between 0.5% and 15%. If the surface coverage is too large, the resistance to the compressive stress may be increased to an extent that is too much. If the surface coverage is too small, the resistance to the compressive stress may not be enough for balance, but the disclosure is not limited thereto. For example, the surface coverage of the non-continuous particulate materials 132 on the second surface 110b may be between 0.5% and 10%. Therefore, in the epitaxial semiconductor structure 100 of this embodiment with the above-mentioned surface coverage, the substrate bending may be reduced and the static discharge performance of a product formed on the epitaxial semiconductor structure 100 may be significantly improved under a same epitaxy parameter, as shown in FIG. 1E, but the disclosure is not limited thereto.

In this embodiment, a part of the non-continuous particulate materials 132 may be agglomerated into clusters. In other words, the non-continuous particulate materials 132 may have different sizes, thereby effectively adjusting and controlling the warpage of the substrate 110 generated in the epitaxy process. For example, the non-continuous particulate materials 132 may have a size of a single particle (as shown in FIG. 1C) and a size of a cluster formed by agglomeration of particles (as shown in FIG. 1D). Specifically, the non-continuous particulate materials 132 may be regular shapes, irregular shapes, crystalline or amorphous polyhedrons, but the disclosure is not limited thereto.

In some embodiments, the size, such as length, width, or thickness, of each non-continuous particulate material 132 is between 1 nanometer and 3 micrometers. Specifically, the size of a single particle may be between 1 nanometer and 3 micrometers, and size of a cluster may be between 1 nanometer and 3 micrometers, but the disclosure is not limited thereto.

In some embodiments, the ratio of a thickness 110T of the substrate 110 to the size of each non-continuous particulate material 132 is between 160 and 1,400,000. Specifically, the ratio of the thickness 110T of the substrate 110 to the size of a single particle may be between 160 and 1,400,000, and the ratio of the thickness 110T of the substrate 110 to the size of a cluster may be between 160 and 1,400,000, but the disclosure is not limited thereto.

In some embodiments, the material of the balance structure 130 includes a semiconductor material or a compound semiconductor material. The semiconductor material is a silicon semiconductor material (for example, silicon, silicon carbide, silicon germanium, etc.). The compound semiconductor material is, for example, a ceramic material (for example, titanium nitride, zirconium nitride, boron nitride, tantalum carbide, zirconium carbide, tungsten carbide, molybdenum disilicide, etc.), a nitride and an alloy thereof (for example, gallium nitride, aluminum nitride, indium nitride, indium gallium nitride, aluminum gallium nitride or aluminum indium gallium nitride, etc.), an arsenide and an alloy thereof (for example, gallium arsenide, aluminum arsenide, indium arsenide, indium gallium arsenide, aluminum gallium arsenide or aluminum indium gallium arsenide, etc.), a phosphide and an alloy thereof (for example, gallium phosphide, aluminum phosphide, indium phosphide, indium phosphide gallium, aluminum gallium phosphide or aluminum indium gallium phosphide, etc.), and an oxide (for example, zinc oxide), but the disclosure is not limited thereto.

In some embodiments, the semiconductor material has a dopant. For example, a silicon semiconductor material may have a dopant such as arsenic, phosphorus, boron, or aluminum, and the compound semiconductor material may have a dopant such as magnesium, silicon, carbon, gallium, indium, or nitrogen, but the disclosure is not limited thereto.

In some embodiments, the material of the balance structure 130 is the same as the material of the semiconductor layer 120; for example, both are III-V group materials. That is, the coefficient of thermal expansion of the balance structure 130 is the same as the coefficient of thermal expansion of the semiconductor layer 120. Therefore, the design difficulty of the arrangement layout of the non-continuous particulate materials 132 may be reduced. Furthermore, in an unillustrated embodiment, the semiconductor layer may include a multi-layer semiconductor structure, and the material of the balance structure and the material of the semiconductor structure close to the substrate in the semiconductor layer may be the same; for example, both are gallium nitride. Therefore, when compressive stress is formed due to epitaxial growth on the semiconductor layer (for example, the substrate is a sapphire and upward in the shape of a convex arc), the balance structure that resists the compressive stress to the substrate may be used to pull back the substrate to the balanced position to effectively adjust and control the warpage problem of the substrate 110 generated in the epitaxy process, but the disclosure is not limited thereto.

In addition, since the flow direction of the heat source in the epitaxy process is usually a direction from the second surface 110b to the first surface 110a, that is, heat is usually transferred from the second surface 110b to the first surface 110a, therefore, in some embodiments, the thermal conductivity coefficient of the balance structure 130 is greater than or equal to the thermal conductivity coefficient of the substrate 110. In this way, the thermal energy distribution in the epitaxy process may be more even. For example, the ratio of the thermal conductivity coefficient of the balance structure 130 to the thermal conductivity coefficient of the substrate 110 may be greater than or equal to 1 and less than or equal to 30, but the disclosure is not limited thereto.

In some embodiments, the balance structure 130 and the semiconductor layer 120 may be formed on the two opposite surfaces of the substrate 110 at the same time through adjusting the parameter, but the disclosure is not limited thereto. In other embodiments, the balance structure 130 may be formed before the semiconductor layer 120 is formed.

It must be noted here that the following embodiments use the element labels and a part of the content of the above-mentioned embodiment. Same or similar reference numerals are used to represent same or similar elements, and the description of the same technical content is omitted. The aforementioned embodiment may be referred to for the descriptions of the omitted parts, and descriptions of those parts will not be repeated in the following embodiments.

Figure 2A:
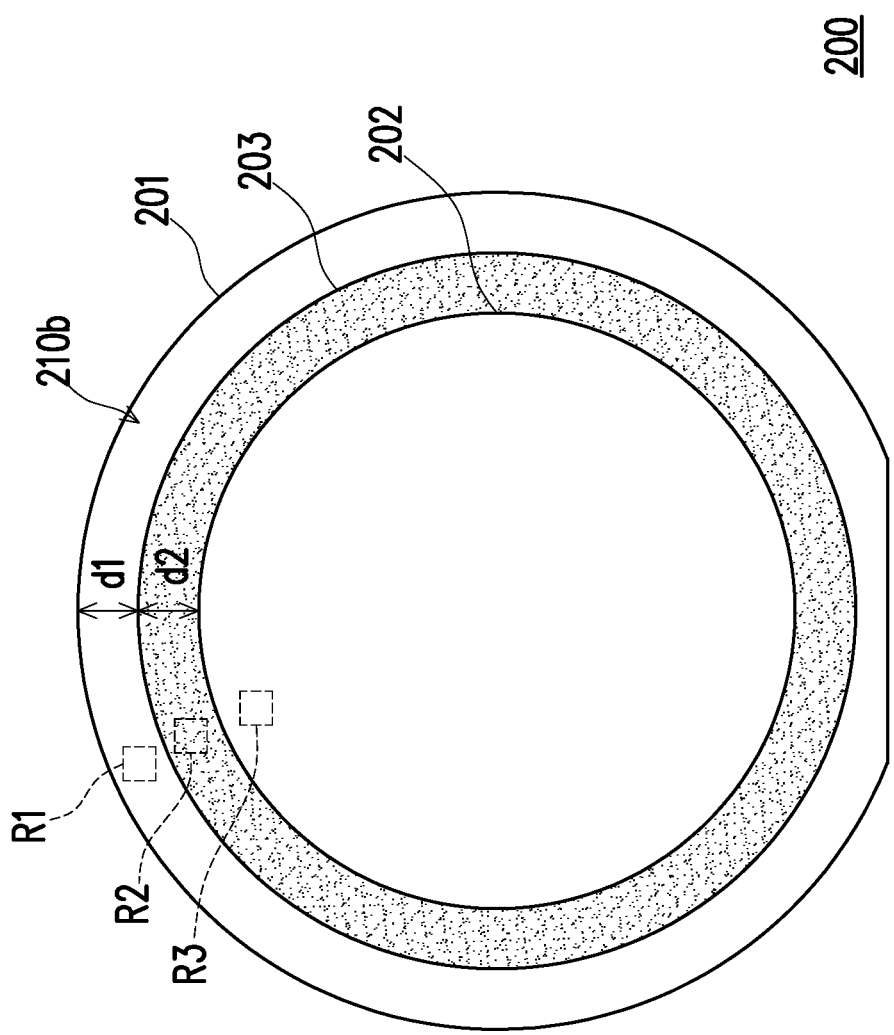
FIG. 2A is a schematic bottom view of an epitaxial semiconductor structure according to another embodiment of the disclosure.

FIG. 2A is a schematic bottom view of an epitaxial semiconductor structure according to another embodiment of the disclosure. FIG. 2B is an enlarged schematic view of a block R1 in FIG. 2A. FIG. 2C is an enlarged schematic view of a block R2 in FIG. 2A. FIG. 2D is an enlarged schematic view of a block R3 in FIG. 2A. Referring to FIGS. 2A to 2D, compared with the epitaxial semiconductor structure 100, a second surface 210b of an epitaxial semiconductor structure 200 of this embodiment is at least divided into a first region 201, a second region 202, and a third region 203 located between the first region 201 and the second region 202. Furthermore, in this embodiment, the non-continuous particulate materials 132 respectively have different distribution densities and surface coverage in the first region 201, the second region 202, and the third region 203. For example, when both sides of a substrate (such as a sapphire substrate) warp upward when a semiconductor layer is formed thereon, the distribution density (as shown in the block R2 of FIG. 2C) of the non-continuous particulate materials 132 in the third region 203 may be greater than the distribution densities (as shown in the block R1 in FIG. 2B and the block R3 in FIG. 2D) of the non-continuous particulate materials 132 in the first region 201 and the second region 202. In addition, the surface coverage of the non-continuous particulate materials 132 in the third region 203 may be greater than the surface coverage of the non-continuous particulate materials in the first region 201 and the second region 202, therefore, since warpage situation is occurred in the peripheral area, the third region 203 having large surface coverage and distribution density in the middle (not disposed too peripheral (like the first region 201)) can improve the warpage situation effectively, and improve the external tension is too large and uneven or the internal tension is not enough problem, but the disclosure is not limited thereto. The distribution density and surface coverage of the non-continuous particulate materials 132 in the first region 201, the second region 202, and the third region 203 may be determined according to actual design requirements. In an unillustrated embodiment, when both sides of a substrate warp downward when a semiconductor layer is formed thereon, the distribution density of the non-continuous particulate materials in the third region may be less than the distribution densities of the non-continuous particulate materials in the second region.

In some embodiments, the third region 203 surrounds the second region 202, and the first region 201 surrounds the third region 203. For example, the third region 203 may be closed around the second region 202, and the first region 201 may be closed around the third region 203, but the disclosure is not limited thereto. In other embodiments, the third region 203 may be non-closed around the second region 202, and the first region 201 may be non-closed around the third region 203; in other words, the first region 201 and the third region 203 may be formed by a plurality of arc sections.

It should be noted that the disclosure does not limit the first region 201, the second region 202, and the third region 203 to have a same surrounding status. For example, the third region 203 may be non-closed around the second region 202, and the first region 201 may be closed around the third region 203. The aforementioned various surrounding statuses may be designed and combined according to actual design requirements.

In some embodiments, the first region 201, the second region 202, and the third region 203 have a circular profile and are in a radial orientation outward from the center of circle of the second region 202, but the disclosure is not limited thereto. The first region 201, the second region 202, and the third region 203 may have a geometric profile such as a rectangle profile, a square profile, a diamond profile, or other suitable geometric profiles. In addition, the first region 201, the second region 202, and the third region 203 may have the same or similar geometric profiles, or the first region 201, the second region 202, and the third region 203 may have different geometric profiles, and the disclosure is not limited.

In some embodiments, a width d1 (for example, the radial width) of the first region 201 may be greater than or equal to 0 and less than or equal to 2 centimeters (cm), and a width d2 (for example, the radial width) of the third region 203 may be greater than or equal to 0 and less than or equal to 1 cm. Based on the above widths, the warpage problem of the substrate generated in the epitaxy process may be adjusted and controlled, but the disclosure is not limited thereto.

Figure 2E:
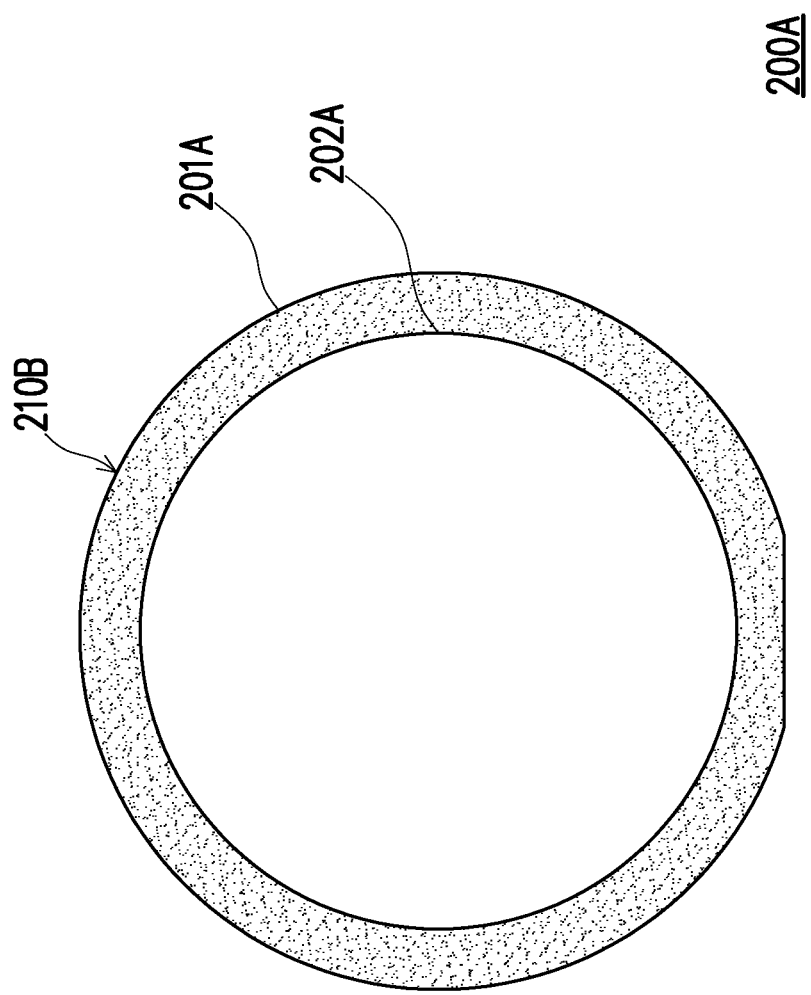
FIG. 2E is a schematic bottom view of an epitaxial semiconductor structure according to yet another embodiment of the disclosure.

FIG. 2E is a schematic bottom view of an epitaxial semiconductor structure according to yet another embodiment of the disclosure. Referring to FIG. 2E, compared with the epitaxial semiconductor structure 200, a second surface 210B of an epitaxial semiconductor structure 200A of this embodiment is divided into only two region (an outer region 201A (first region) and an inner region 202A (second region)). Furthermore, in this embodiment, the non-continuous particulate materials (not shown) respectively have different distribution densities and surface coverage in the outer region 201A and the inner region 202A. For example, when both sides of a substrate (such as a sapphire substrate) warp upward when a semiconductor layer is formed thereon, the distribution density of the non-continuous particulate materials in the outer region 201A may be greater than the distribution densities of the non-continuous particulate materials in the inner region 202A. In addition, the surface coverage of the non-continuous particulate materials in the outer region 201A may be greater than the surface coverage of the non-continuous particulate materials in the inner region 202A, therefore, this arrangement can solve upward warpage problem effectively, but the disclosure is not limited thereto. Furthermore, if the surface coverage is too large, the resistance to the compressive stress may be increased to an extent that is too much, and if the surface coverage is too small, the resistance to the compressive stress may not be enough for balance, therefore, the surface coverage of the non-continuous particulate materials in the outer region 201A may be greater than the surface coverage of the non-continuous particulate materials in the inner region 202A at least 2 times and less than 100 times, but the disclosure is not limited thereto. In an unillustrated embodiment, when both sides of a substrate warp downward when a semiconductor layer is formed thereon, the distribution density of the non-continuous particulate materials in the outer region may be less than the distribution densities of the non-continuous particulate materials in the inner region.

Figure 3:
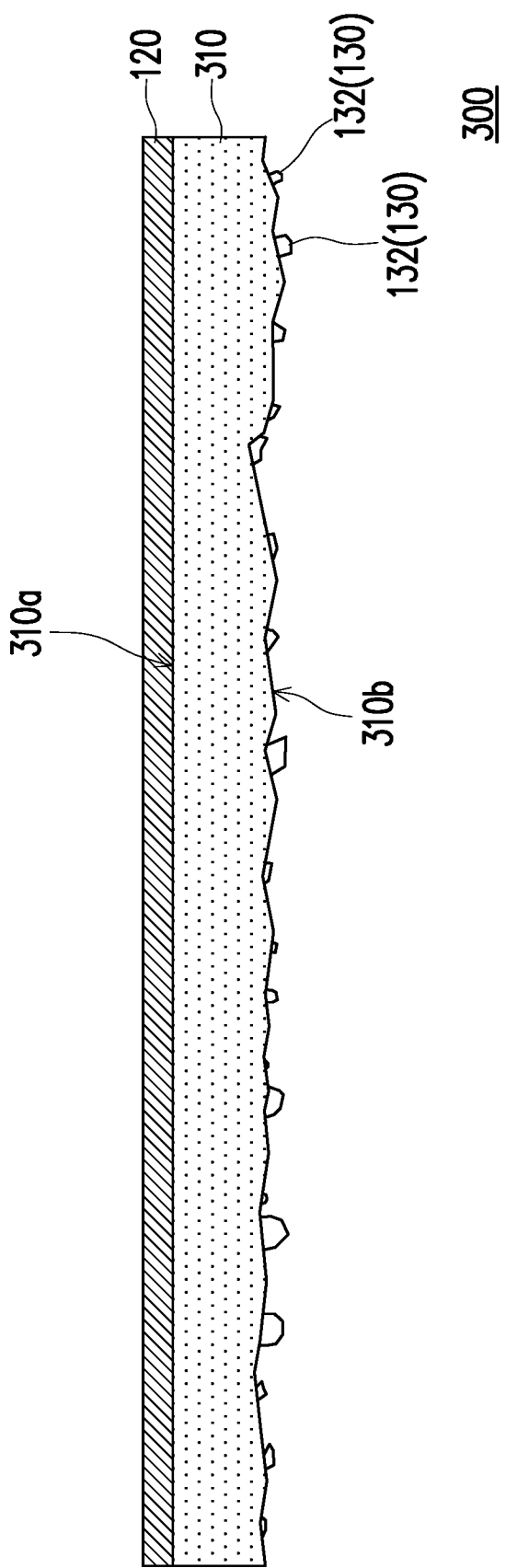
FIG. 3 is a schematic cross-sectional view of an epitaxial semiconductor structure according to still another embodiment of the disclosure.

FIG. 3 is a schematic cross-sectional view of a portion of an epitaxial semiconductor structure according to still another embodiment of the disclosure. Referring to FIG. 3, compared with the epitaxial semiconductor structure 100, in a substrate 310 of this embodiment, a first surface 310a may be a flat surface, and a second surface 310b may be a concavo-convex surface. For example, the ratio of the roughness (Ra) of the second surface 310b to the size of each non-continuous particulate material 132 is between 0.1 and 3000. Specifically, the ratio of the roughness of the second surface 310b to a size of a single particle is between 0.1 and 3000, and the ratio of the roughness of the second surface 310b to size of a cluster is between 0.1 and 3000, but the disclosure is not limited thereto. Compared with a flat surface, the balance structure 130 and the second surface 310 that is concavo-convex surface may better regulate the thermal stress generated during epitaxy. In here, the roughness and density of the unevenness can also correspond to the coverage and distribution of the balance structure 130, for example, the roughness and density of the second surface in the third region 203 are greater than the roughness and density of the other two regions (correspond to region of FIG. 2A), therefore, it can have a better balance effect. In an unillustrated embodiment, the first surface may be concavo-convex, which may have a better control effect. More preferably, when both sides of a substrate (such as a sapphire substrate) warp upward when a semiconductor layer is formed on the substrate, the roughness of the first surface is greater than the roughness of the second surface, so that a better balance may be achieved. When both sides of a substrate (such as a silicon substrate) warp downward when a semiconductor layer is formed on the substrate, the roughness of the first surface is smaller than the roughness of the second surface, so that a better balance may be achieved.

In summary, since the semiconductor layer and the balance structure are respectively formed on the two surfaces of the substrate that are opposite to each other, the thermal stress on the substrate is balanced through making the direction of stress generated by the balance structure to the substrate to be different from the direction of stress generated by the semiconductor layer to the substrate. In addition, since the balance structure is composed of a plurality of non-continuous partial materials, such that different epitaxy conditions may be flexibly matched to correspond to the stress distribution on the substrate. Therefore, in the epitaxial semiconductor structure of the disclosure, warpage problem generated in the epitaxy process may be effectively adjusted and controlled, and quality of the epitaxial semiconductor structure may be improved, thereby products subsequently formed on the epitaxial semiconductor structure may have better optical characteristics. In addition, the thermal conductivity coefficient of the balance structure may be greater than or equal to the thermal conductivity coefficient of the substrate. In this way, the thermal energy distribution in the epitaxy process may be more even.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the protection scope of the disclosure is subject to the scope of the appended claims.

What is claimed is:

1. An epitaxial semiconductor structure, comprising:
a substrate, having a first surface and a second surface opposite to each other;
a semiconductor layer, formed on the first surface; and
a balance structure, formed on the second surface, wherein the balance structure is configured to balance thermal stress on the substrate, the balance structure is composed of a plurality of non-continuous particulate materials, the second surface is at least divided into a first region, a second region and a third region, the first region surrounds the second region, the third region is located between the first region and the second region, and the non-continuous particulate materials have different surface coverages in the first region, the second region, and the third region.

2. The epitaxial semiconductor structure according to claim 1, wherein the non-continuous particulate materials are randomly distributed on the second surface.

3. The epitaxial semiconductor structure according to claim 1, wherein a distribution density of the non-continuous particulate materials on the second surface is between 0.001 per/micrometer square to 10 per/micrometer square.

4. The epitaxial semiconductor structure according to claim 1, wherein surface coverage of the non-continuous particulate materials on the second surface is between 0.5% and 15%.

5. The epitaxial semiconductor structure according to claim 1, wherein the surface coverage of the non-continuous particulate materials in the first region is greater than the surface coverage of the non-continuous particulate materials in the second region.

6. The epitaxial semiconductor structure according to claim 1, wherein the surface coverage of the non-continuous particulate materials in the third region is greater than the surface coverage of the non-continuous particulate materials in the first region and the second region.

7. The epitaxial semiconductor structure according to claim 1, wherein a size of each of the non-continuous particulate materials is between 1 nanometer and 3 micrometers.

8. The epitaxial semiconductor structure according to claim 1, wherein a ratio of a thickness of the substrate to a size of each of the non-continuous particulate materials is between 160 and 1,400,000.

9. The epitaxial semiconductor structure according to claim 1, wherein the second surface is a concavo-convex surface, and a ratio of roughness of the second surface to a size of each of the non-continuous particulate materials is between 0.1 and 3000.

10. The epitaxial semiconductor structure according to claim 1, wherein a thermal conductivity coefficient of the balance structure is greater than or equal to a thermal conductivity coefficient of the substrate.

11. The epitaxial semiconductor structure according to claim 10, wherein a ratio of the thermal conductivity coefficient of the balance structure to the thermal conductivity coefficient of the substrate is greater than or equal to 1 and less than or equal to 30.

12. The epitaxial semiconductor structure according to claim 1, wherein a material of the balance structure comprises a semiconductor material or a compound semiconductor material.

13. The epitaxial semiconductor structure according to claim 12, wherein the material of the balance structure is the same as a material of the semiconductor layer.

14. An epitaxial substrate, adapted for growth of a semiconductor layer, comprising:
a substrate, having a first surface and a second surface opposite to each other; and
a balance structure, formed on the second surface, wherein the balance structure is configured to balance thermal stress on the substrate, the balance structure is composed of a plurality of non-continuous particulate materials, the second surface is at least divided into a first region, a second region and a third region, the first region surrounds the second region, the third region is located between the first region and the second region, and the non-continuous particulate materials have different surface coverages in the first region, the second region, and the third region.

* * * * *